United States Patent
Kohli et al.

(10) Patent No.: US 10,236,071 B1
(45) Date of Patent: Mar. 19, 2019

(54) DUAL-BIT ROM CELL WITH VIRTUAL GROUND LINE AND PROGRAMMABLE METAL TRACK

(71) Applicant: NXP B.V., Eindhoven (NL)

(72) Inventors: Rajat Kohli, Bangalore (IN); Patrick Van De Steeg, Eindhoven (NL); Jwalant Kumar Mishra, Bangalore (IN); Pankaj Agarwal, Bangalore (IN)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 15/700,152

(22) Filed: Sep. 10, 2017

(51) Int. Cl.
  *G11C 17/12* (2006.01)
  *G11C 11/40* (2006.01)
  *G11C 11/56* (2006.01)

(52) U.S. Cl.
  CPC ............ *G11C 17/126* (2013.01); *G11C 11/40* (2013.01); *G11C 11/5692* (2013.01)

(58) Field of Classification Search
  CPC ...... G11C 17/12; G11C 17/126; H01L 27/112
  USPC ........................................................ 365/104
  See application file for complete search history.

(56) References Cited

U.S. PATENT DOCUMENTS

| 5,917,224 | A | 6/1999 | Zangara |
| 6,002,607 | A | 12/1999 | Dvir |
| 7,002,827 | B1 | 2/2006 | Sabharwal et al. |
| 8,125,815 | B2 | 2/2012 | Brown et al. |
| 8,406,031 | B2 | 3/2013 | Buer et al. |
| 8,422,262 | B2 | 4/2013 | Nevers et al. |
| 9,087,588 | B2 | 7/2015 | Kwon |
| 9,202,588 | B1 * | 12/2015 | Kohli ..................... G11C 17/12 |
| 9,691,496 | B1 | 6/2017 | Kohli et al. |
| 9,697,908 | B1 | 7/2017 | Rathi et al. |
| 2002/0091894 | A1 | 7/2002 | Garg |
| 2002/0181269 | A1 | 12/2002 | Jeung et al. |
| 2011/0267883 | A1 | 11/2011 | Lee et al. |
| 2014/0241028 | A1 * | 8/2014 | Roy ..................... G11C 17/146 365/72 |
| 2017/0025185 | A1 | 1/2017 | Rawat et al. |

OTHER PUBLICATIONS

Cui, Wei, "Design of Small Area and Low Power Consumption Mask ROM", IEEE International Conference on Integrated Circuit Design and Technology, 2007. ICICDT '07. pp. 1-4, 2007.

* cited by examiner

*Primary Examiner* — Huan Hoang
*Assistant Examiner* — Minh Dinh
(74) *Attorney, Agent, or Firm* — Charles E. Bergere (57) ABSTRACT

A read-only memory (ROM) device includes memory cells, bit-line pairs, a virtual ground line, and a programmable metal track. The memory cells are arranged in an array of rows and columns. Each memory cell stores two bits of data. The virtual ground line is disposed vertically and shared by two adjacent columns. The programmable metal track connects a memory cell to the virtual ground line based on a value of the two bits of data stored in the memory cell.

16 Claims, 8 Drawing Sheets

| | CELL01 | | | CELL23 | | CELL45 | | | CELL67 | | PREDEFINED INPUTS | | | | | | | |
|---|---|---|---|---|---|---|---|---|---|---|---|---|---|---|---|---|---|---|
| | BL0 | BL1 | VGND0 | BL2 | BL3 | BL4 | BL5 | VGND1 | BL6 | BL7 | Y7 | Y6 | Y5 | Y4 | Y3 | Y2 | Y1 | Y0 |
| | RD | 0 | 0 | X | X | X | X | X | X | X | 0 | 0 | 0 | 0 | 0 | 0 | 0 | 1 |
| | 0 | RD | 0 | X | X | X | X | X | X | X | 0 | 0 | 0 | 0 | 0 | 0 | 1 | 0 |
| | X | X | 0 | RD | 0 | X | X | X | X | X | 0 | 0 | 0 | 0 | 0 | 1 | 0 | 0 |
| | X | X | 0 | 0 | RD | X | X | X | X | X | 0 | 0 | 0 | 0 | 1 | 0 | 0 | 0 |
| | X | X | X | X | X | RD | 0 | 0 | X | X | 0 | 0 | 0 | 1 | 0 | 0 | 0 | 0 |
| | X | X | X | X | X | 0 | RD | 0 | X | X | 0 | 0 | 1 | 0 | 0 | 0 | 0 | 0 |
| | X | X | X | X | X | X | X | 0 | RD | 0 | 0 | 1 | 0 | 0 | 0 | 0 | 0 | 0 |
| | X | X | X | X | X | X | X | 0 | 0 | RD | 1 | 0 | 0 | 0 | 0 | 0 | 0 | 0 |

FIG. 6

DUAL-BIT ROM CELL WITH VIRTUAL GROUND LINE AND PROGRAMMABLE METAL TRACK

BACKGROUND

The present invention generally relates to memory devices, and, more particularly, to a read-only memory (ROM) device having single transistor memory cells that store two bits of data.

ROM devices are used for storing data by various electronic devices. A ROM device typically includes bit-lines, virtual ground lines, and an array of memory cells that each store a single bit of data. ROM devices retain the stored data even when the power of the electronic device is turned OFF. Typically, ROM devices are used to store data that does not require frequent updates.

Data can be stored or the ROM device is programmed during manufacturing. For example, data may be stored/programmed during the ion diffusion process of the semiconductor substrate of the ROM device. In another example, data may be stored during a metallization process of the ROM device. In yet another example, data is stored during a via formation process of the ROM device.

Figure 1:
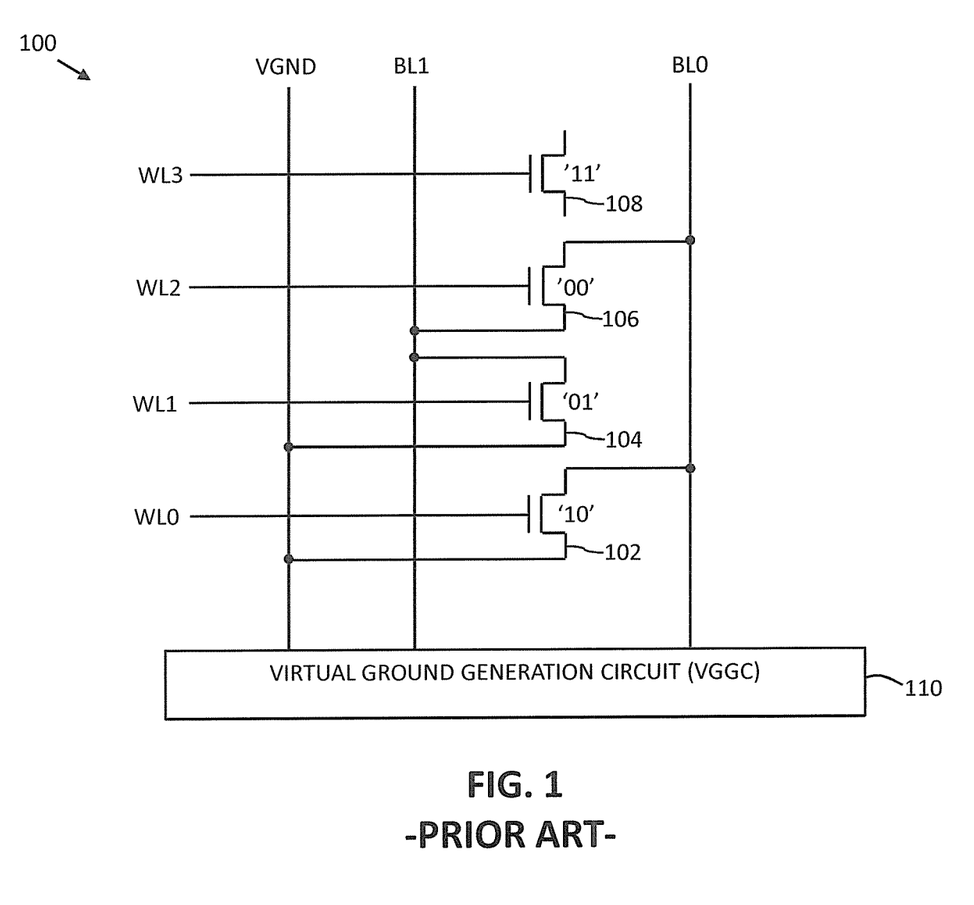
FIG. 1 is a schematic circuit diagram of a conventional ROM device.

One way to achieve higher density is to reduce the width of the memory cells of the ROM device. However, one consequence of the reduced width is that the ROM device cannot operate at low input voltages. Thus, for low voltage devices, it is preferred not to decrease the width of the memory cells, which results in low density. One known technique to increase density is to store two bits of bit data in a single memory cell, as shown in FIG. 1, and also as described in U.S. Pat. Nos. 9,202,588 and 9691,496, each of which is herein incorporated by reference.

FIG. 1 is a schematic circuit diagram of a conventional ROM device 100 that includes first through fourth transistors 102-108 and a virtual ground generation circuit (VGGC) 110. The first through fourth transistors 102-108 constitute first through fourth memory cells. The ROM device 100 further includes first and second bit-lines BL0 and BL1, a virtual ground line VGND, and first through fourth word lines WL0-WL3. Each of the word lines WL0-WL3 is connected to output lines of an address decoder (not shown) for switching ON one of the transistors 102-108. The first and second bit-lines BL0 and BL1 and the virtual ground line VGND are connected to the VGGC 110. The VGGC 110 controls voltage levels of the first and second bit-lines BL0 and BL1 to perform a read operation, such that one bit of the data stored in the transistors 102-108 can be read at a time. The first through fourth transistors 102-108 are arranged in a column between the first and second bit-lines BL0 and BL1. Each of the transistors 102-108 stores two bits of data depending on the connections of the transistors 102-108 with the first and second bit-lines BL0 and BL1, and the virtual ground line VGND.

The first transistor 102 has a source connected to the first bit-line BL0 and a drain connected to the virtual ground line VGND. The first transistor 102 stores bits "10" based on the connection of its source and drain terminals with the first bit-line BL0 and the virtual ground line VGND, respectively. The first transistor 102 has a gate connected to the first word-line WL0. To read the data stored in the first transistor 102, an address decoder activates the first word-line WL0, which in turn switches ON the first transistor 102.

The second transistor 104 has a source connected to the second bit-line BL1 and a drain connected to the virtual ground line VGND. The second transistor 104 stores bits "01" based on the connection of its source and drain terminals with the second bit-line BL1 and the virtual ground line VGND, respectively. The second transistor 104 has a gate connected to the second word-line WL1. To read the data stored in the second transistor 104, the address decoder activates the second word-line WL1, which in turn switches ON the second transistor 104.

The third transistor 106 has a source connected to the first bit-line BL0 and a drain terminal to the second bit-line BL1. The third transistor 106 stores bits "00" based on the connection of its source and drain terminals with the first bit-line BL0 and the second bit-line BL1, respectively. The third transistor 106 has a gate connected to the third word-line WL2. To read the data stored in the third transistor 106, the address decoder activates the third word-line WL2, which in turn switches ON the third transistor 106.

The fourth transistor 108 has source and drain terminals that are not connected to any of either the first and second bit-lines BL0 and BL1, or the virtual ground line VGND. The fourth transistor 108 stores bits "11". The fourth transistor 108 has a gate connected to the fourth word-line WL4. To read the data stored in the fourth transistor 108, the address decoder activates the fourth word-line WL4, which in turn switches ON the fourth transistor 108.

The ROM device 100 uses two bit-lines for a single memory cell. Thus, the width of each of the first through fourth memory cells 102-108 is greater than corresponding minimum processing widths. Hence, the ROM device 100 can be operated at low input voltages. However, the density of the ROM device 100 could be improved if the number of bit lines could be reduced. It would be advantageous to have a higher density ROM device.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements. It will be understood by those of skill in the art that the figures are not necessarily drawn to scale.

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a ROM device including a plurality of memory cells, a plurality of bit-line pairs, a virtual ground line, and a first programmable metal track. The memory cells are arranged in an array having a plurality of rows and a plurality of columns. Each memory cell stores two bits of data. First and second ones of the memory cells are adjacent to each other, have a common drain terminal, and are arranged in a first column of the plurality of columns. The bit-line pairs are disposed vertically and are associated with the plurality of columns. A first bit-line pair is associated with the first column. The virtual ground line is disposed vertically and shared between the first column and a second column that is adjacent to the first column. The first programmable metal track is disposed horizontally and connects the first memory cell to the virtual ground line. The first programmable metal track is defined based on a value of the two bits of data stored in the first memory cell.

In another embodiment, the present invention provides a ROM device includes a plurality of memory cells, a plurality of bit-line pairs, a virtual ground line, and first and second programmable metal tracks. The memory cells are arranged in an array that includes a plurality of rows and a plurality of columns. Each memory cell stores two bits of data. First and second ones of the memory cells are adjacent to each other, have a common drain terminal, and are arranged in a first column of the plurality of columns. The bit-line pairs are disposed vertically and are associated with the plurality of columns. A first bit-line pair is associated with the first column. The virtual ground line is disposed vertically and is shared by the first column and a second column that is adjacent to the first column. The first programmable metal track is disposed horizontally to connect the first memory cell to the virtual ground line. The first programmable metal track is defined based on the value of the two bits of data stored in the first memory cell. The second programmable metal track is disposed horizontally to connect the first memory cell to a first bit-line of the first bit-line pair. The second programmable metal track is defined based on the value of the data stored in the first memory cell.

Various embodiments of the present invention provide a ROM device that includes a plurality of memory cells, a plurality of bit-line pairs, a virtual ground line, and a first programmable metal track. The memory cells are arranged in a plurality of rows and columns. Each memory cell stores two bits of data. A first column includes first and second memory cells. The first and second memory cells have a common drain terminal and are placed adjacent to each other. The bit-line pairs are disposed vertically and are associated with the plurality of columns. The virtual ground line is shared by the first column and a second column that is adjacent to the first column. The virtual ground line is disposed between first and second bit-line pairs, such that the first bit-line pair corresponds to the first column and the second bit-line pair corresponds to the second column. The first programmable metal track is disposed beneath the virtual ground line to connect the first memory cell to the virtual ground line based on the value of the data stored in the first memory cell.

Sharing the virtual ground line by the first and second columns reduces design complexity. As fewer virtual ground lines are required, the area of the ROM device is reduced, which results in high-density for the ROM device. Since each memory cell corresponds to two bit-lines, the width of each memory cell is greater than a corresponding minimum processing width, so the ROM device can operate at a low input voltage. As the first programmable metal track is defined to connect the first memory cell to the virtual ground line only when required, the metal parasitic capacitance of the ROM device is reduced.

Figure 2A:
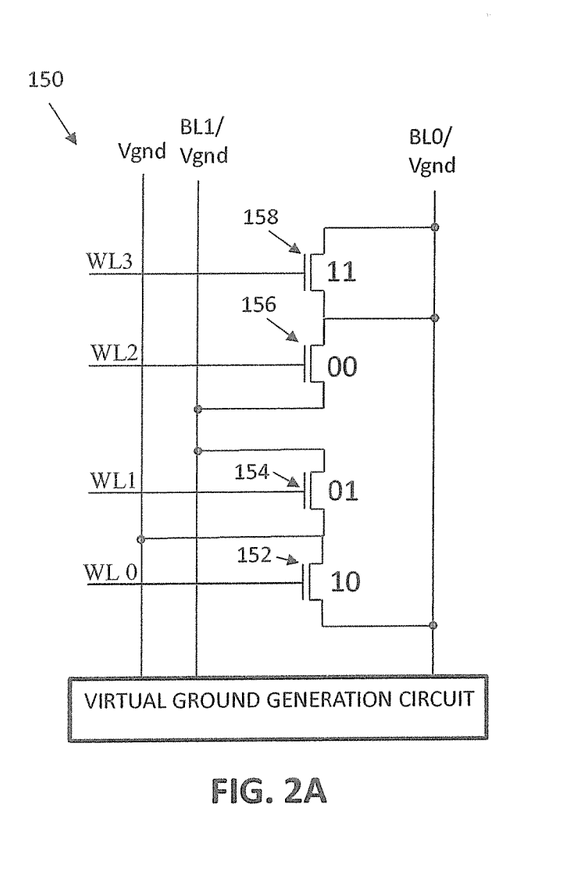
FIG. 2A is a schematic circuit diagram of a bit cell of a ROM device in accordance with an embodiment of the present invention.

Referring now to FIG. 2A, a schematic circuit diagram of a bit cell 150 of a ROM device in accordance with an embodiment of the present invention is shown. The bit cell 150 comprises a parallel or NOR type ROM cell formed with NMOS, and shows a 4×2 array implementation. The bit cell 150 is a 1T bit cell, which stores 2 bits of data ('00', '01', '10', and '11'), as shown. The bit cell 150 comprises four transistors 152, 154, 156 and 158, two bit lines BL0 and BL1, and a shared Vgnd track. The first transistor 152 has a gate connected to a first word line WL0 and a source connected to the first bit line BL0. The second transistor 154 has a gate connected to a second word line WL1, a drain connected to a drain of the first transistor 152 and to the Vgnd track, and a source connected to the second bit line BL1. The third transistor 156 has a gate connected to a third word line WL2, a source connected to the second bit line BL1, and a drain connected to the first bit line BL0. The fourth transistor 158 has a gate connected to a fourth word line WL3, a drain connected to the drain of the third transistor 156 and to the first bit line BL0, and a source also connected to the first bit line BL0. As can be seen, the bit cell 150 is shared between the two bit lines BL0 and BL1. Also as can be seen, the drain is shared between two column bit cells, and one Vgnd track is shared by two physical bit cells. The first transistor 152 stores the value '10', the second transistor 154 stores the value '01', the third transistor 156 stores the value '00', and the fourth transistor 158 stores the value '11'. One data out of the two values stored can be read at a time. The structure of the bit cell 150 is such that metal1 can be programmed such that beneath Vgnd metal2 track, metal1 is placed whenever required. It will be understood by those of skill in the art that the bit cell 150 may be formed using PMOS devices.

Figure 2B:
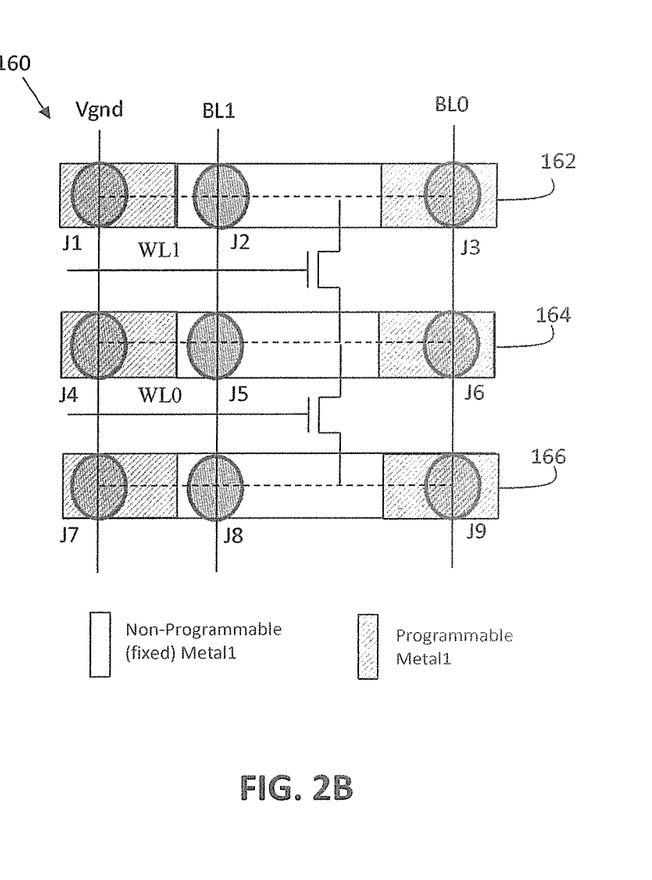
FIG. 2B is a layout schematic diagram of a portion of a bit cell of a ROM device in accordance with an embodiment of the present invention.

FIG. 2B is a layout schematic diagram of a portion of a bit cell 160 of a ROM device in accordance with an embodiment of the present invention. FIG. 2B shows the layout and schematic correspondence of various nets of the bit cell 160 (where one bit cell stores two data bits as shown in FIG. 2A). FIG. 2B shows three metal tracks 162, 164 and 166, and junctions J1-J9 where a via may be placed, depending on the data stored, to program the content of the bit cell 160. The metal tracks 162, 164, 166 are programmable on the left and right sides, as indicated with the dashed line shading, and each metal track 162, 164, 166 has a non-programmable center section (solid shading). Making the metal tracks programmable reduces the bit line capacitance of metal1. Any one of J1 or J2 or J3/J4 or J5 or J6/J7 or J8 or J9 will be connected for a given data value. If a via is needed at J1, J4 or J7 (based on the data), then a metal1 patch will also come below the metal track. Similarly, if a via is needed at J3, J6 or J9, a metal1 patch will come below the metal track. Programmable metal1—left will occur whenever a Vgnd connection is required (and in such case there will not be the programmable metal—right section). If not required, then programmable metal1—right will be provided to satisfy metal1 min area design rules (DRC). Also, the Vgnd track is shared between two adjacent physical bit cells as the metal1 beneath it comes only when Vgnd is required.

Figure 3A:
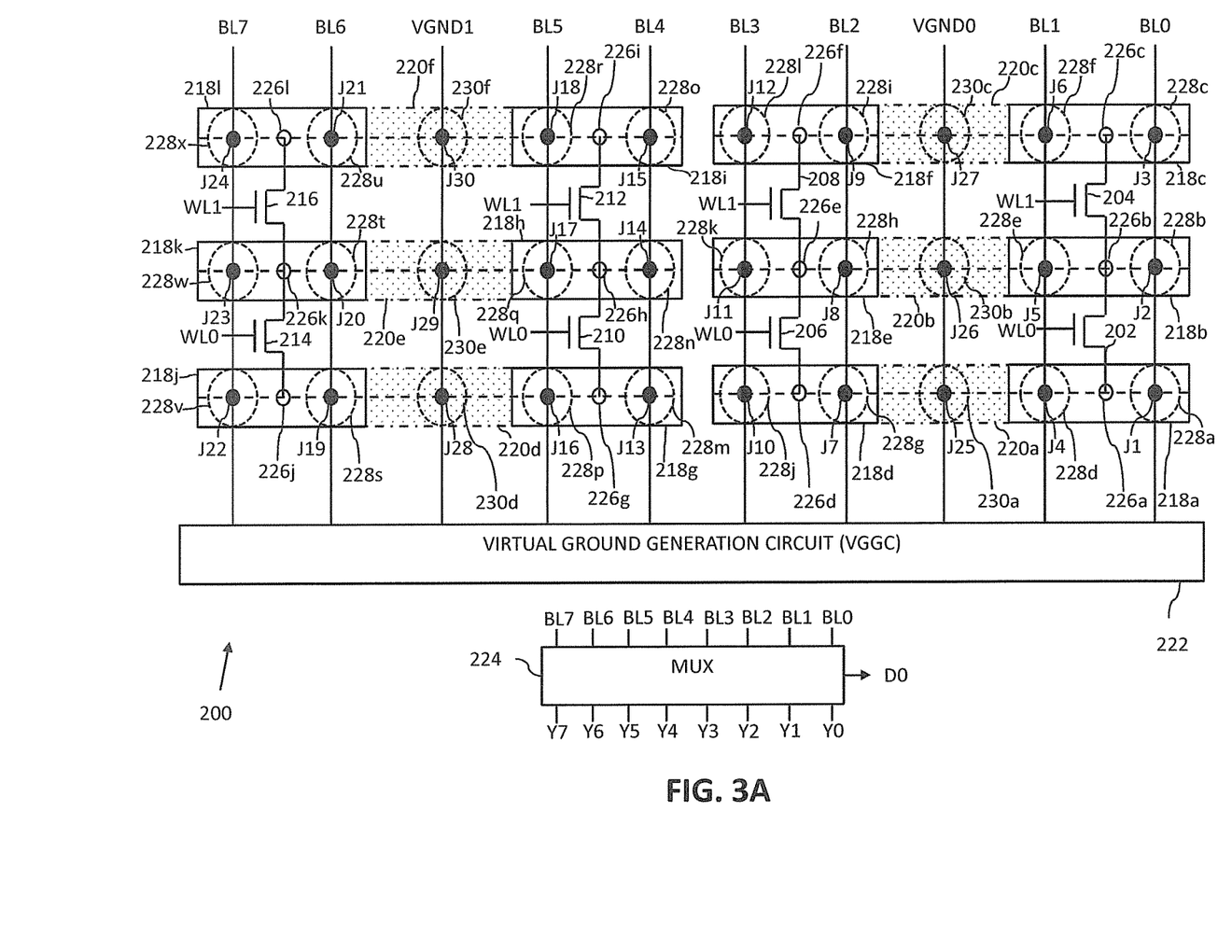
FIG. 3A is a schematic circuit diagram of a ROM device in accordance with an embodiment of the present invention.

FIG. 3A is a schematic circuit diagram of a ROM device 200 in accordance with an embodiment of the present invention. The ROM device 200 includes a plurality of memory cells including first through eighth memory cells 202-216 that are arranged in an array of first and second rows, and first through fourth columns. Each memory cell includes a transistor and the first through eighth memory cells 202-216 may be referred to as first through eighth transistors, respectively. In one embodiment, the first through eighth transistors 202-216 are NMOS transistors, and in another embodiment, the first through eighth transistors 202-216 are PMOS transistors. The first column includes the first and second transistors 202 and 204, the second column includes the third and fourth transistors 206 and 208, the third column includes the fifth and sixth transistors 210 and 212, and the fourth column includes the seventh and eighth transistors 214 and 216.

The ROM device 200 further includes first through fourth bit-line pairs that are associated with the first through fourth columns, respectively. The first bit-line pair includes first and second bit-lines BL0 and BL1, the second bit-line pair includes third and fourth bit-lines BL2 and BL3, the third bit-line pair includes fifth and sixth bit-lines BL4 and BL5, and the fourth bit-line pair includes seventh and eighth bit-lines BL6 and BL7. The first through eighth bit-lines BL0-BL7 are disposed vertically (i.e., parallel to the columns). The first and second bit-lines BL0 and BL1 correspond to the first column, the third and fourth bit-lines BL2 and BL3 correspond to the second column, the fifth and sixth bit-lines BL4 and BL5 correspond to the third column, and the seventh and eighth bit-lines BL6 and BL7 correspond to the fourth column.

The ROM device 200 also includes first and second virtual ground lines VGND0 and VGND1, first and second word-lines WL0 and WL1, first through twelfth non-programmable metal tracks 218a-218l, and first through sixth programmable metal tracks 220a-220f. The ROM device 200 further includes a virtual ground generation circuit (VGGC) 222 and a multiplexer 224. The first through eighth bit-lines BL0-BL7 are connected to the VGGC 222 and the multiplexer 224. In one embodiment, the first through twelfth non-programmable metal tracks 218a-218l and the first through sixth programmable metal tracks 220a-220f are formed in a first metal layer (i.e., formed in one metal layer of a multi-layer semiconductor device). The first through eighth bit-lines BL0-BL7 and the first and second virtual ground lines VGND0 and VGND1 are formed in a second metal layer.

The first virtual ground line VGND0 is disposed vertically between the first and second bit-line pairs such that the first and second columns share the first virtual ground line VGND0. Similarly, the second virtual ground line VGND1 is disposed vertically between the third and fourth bit-line pairs such that the third and fourth columns share the second virtual ground line VGND1. The first and second virtual ground lines VGND0 and VGND1 are connected to the VGGC 222. In another embodiment, the first and second virtual ground lines VGND0 and VGND1 are connected to ground.

Gate terminals of the first, third, fifth, and seventh transistors 202, 206, 210, and 214 are connected to the first word-line WL0 and gate terminals of the fourth, sixth, and eighth transistors 204, 208, 212, and 216 are connected to the second word-line WL1. Each of the first and second word-lines WL0 and WL1 are further connected to output lines of an address decoder (not shown). The address decoder activates one of the first and second word-lines WL0 and WL1 for a predefined time interval based on voltage levels of the output lines by providing either a high or low logic signal (depending on whether the decoder uses high or low active logic). In one example, the address decoder provides a high logic signal to activate one of the first and second word-lines WL0 and WL1 for the predefined time interval. The first, third, fifth, and seventh transistors 202, 206, 210, and 214 are switched ON when the first word-line WL0 is active. The second, fourth, sixth, and eighth transistors 204, 208, 212, and 216 are switched ON when the second word-line WL1 is active.

The source terminal of the first transistor 202 is connected to one of the first bit-line BL0, the second bit-line BL1, and the first virtual ground line VGND0 based on dual-bit data to be stored in the first transistor 202. Similarly, the drain terminal of the first transistor 202 is connected to one of the first bit-line BL0, the second bit-line BL1, and the first virtual ground line VGND0 based on the dual-bit data that is stored in the first transistor 202. It will be apparent to a person skilled in the art that the connections of the source and drain terminals of each of the second through eighth transistors 204-216 with corresponding first through eighth bit-lines BL0-BL7 and the corresponding first and second virtual ground lines VGND0 and VGND1 are based on the dual-bit data to be stored by each of the second through eighth transistors 204-216. The storing of the dual-bit data in each of the first through eighth transistors 202-216 is explained in conjunction with FIG. 3B.

The first through twelfth non-programmable metal tracks 218a-218l are fixed metal strips and are disposed horizontally to connect the first through eighth transistors 202-216 to the corresponding first through eighth bit-lines BL0-BL7. The first through twelfth non-programmable metal tracks 218a-218l are disposed beneath the first through eighth bit-lines BL0-BL7. Each of the first through twelfth non-programmable metal tracks 218a-218l forms a junction with the corresponding first through eighth bit-lines BL0-BL7. Thus, the first through twelfth non-programmable metal tracks 218a-218l form first through twenty-fourth junctions J1-J24 with the corresponding first through eighth bit-lines BL0-BL7 as illustrated in FIG. 3A. In an example embodiment, the first non-programmable metal track 218a forms the first junction J1 and the fourth junction J4 with the first and second bit-lines BL0 and BL1, respectively. Further, the first through twelfth non-programmable metal tracks 218a-218l are connected to the source and drain terminals of the corresponding first through eighth transistors 202-216 by way of first through twelfth metal contacts 226a-226l, as illustrated in FIG. 3A. The first through twelfth metal contacts 226a-226l are fixed metal contacts in the ROM device 200. In one example, the first non-programmable metal track 218a is connected to the source terminal of the first transistor 202 by way of the first metal contact 226a. The second non-programmable metal track 218b is connected to the drain terminal of the first transistor 202 by way of the second metal contact 226b. The first through twelfth non-programmable metal tracks 218a-218l connect the source and drain terminals of the first through eighth transistors 202-216 to the corresponding first through eighth bit-lines BL0-BL7 by way of first through twenty-fourth vias 228a-228x, as illustrated in FIG. 3A. In one example, the first non-programmable metal track 218a connects the source terminal of the first transistor 202 to the first bit-line BL0 by way of the first via 228a, which is inserted at the first junction J1. In another example, the first non-programmable metal track 218a connects the source terminal of the first transistor 202 to the second bit-line BL1 by way of the fourth via 228d, which is inserted at the fourth junction J4. In another example, the second non-programmable metal track 218b connects the drain terminal of the first transistor 202 to the first bit-line BL0 by way of the second via 228b, which is inserted at the second junction J2.

The first through sixth programmable metal tracks 220a-220f are disposed horizontally to connect the first through eighth transistors 202-216 to the corresponding first and second virtual ground lines VGND0 and VGND1 based on the corresponding two bits of data to be stored. The first through sixth programmable metal tracks 220a-220f are disposed beneath the first and second virtual ground lines VGND0 and VGND1. The first through sixth programmable metal tracks 220a-220f form twenty-fifth through thirtieth junctions J25-J30 with the corresponding first and second virtual ground lines VGND0 and VGND1, as illustrated in FIG. 3A. In one example, the first programmable metal track 220a forms the twenty-fifth junction J25 with the first virtual ground line VGND0. The first through sixth programmable metal tracks 220a-220f are defined (sized, shaped and located) to connect the source and drain terminals of the first through eighth transistors 202-216 to the corresponding first and second virtual ground lines VGND0 and VGND1 by way of the twenty-fifth through thirtieth vias 230a-230f and the first through twelfth non-programmable metal tracks 218a-218l, as illustrated in FIG. 3A. In one example, the first programmable metal track 220a is disposed beneath the first virtual ground line VGND0 to connect the source terminal of the first transistor 202 to the first virtual ground line VGND0 by way of the first non-programmable metal track 218a and the twenty-fifth via 230a inserted at the twenty-fifth junction J25.

The VGGC 222 controls voltage levels of the first through eighth bit-lines BL0-BL7 to read the two bits of data stored in each of the first through eighth transistors 202-216. The voltage levels of the first through eighth bit-lines BL0-BL7 are controlled in such a way that each bit-line BL performs one read operation at a time. Thus, one bit of the two bits of data stored in one of the first through eighth transistors 202-216 is read at a time. In one example, the VGGC 222 connects the first bit-line BL0 to a first voltage level "RD", and the second through eighth bit-lines BL1-BL7, and the first and second virtual ground lines VGND0 and VGND1 to a second voltage level, such as ground, to read one bit of the data stored in the first transistor 202 on the first bit-line BL0.

The multiplexer 224 is connected to the first through eighth bit-lines BL0-BL7. The multiplexer 224 includes first through eighth input terminals Y0-Y7 and an output terminal D0. The first through eighth input terminals Y0-Y7 receive first through eighth predefined inputs (not shown), respectively, from an external controller (not shown). At a given time, one of the predefined inputs is at a first logic state (e.g., logic high) and the remaining predefined inputs are at a second logic state (e.g., logic low). Based on the logic state of the predefined inputs at the corresponding input terminals Y0-Y7, one of the first through eighth bit-lines BL0-BL7 receives the first voltage level "RD" for reading the corresponding bit of the two bits of data. For example, if the first predefined input is high and the second through eighth predefined inputs are low, then the first bit-line BL0 receives the first voltage level "RD" and the output terminal D0 outputs the corresponding bit of the two bits of data. The operation of the multiplexer 224 will be explained in more detail in conjunction with FIG. 5.

Each of the first through eighth transistors 202-216 stores one of the dual-bits "00", "01", "10", and "11" as the dual-bit data (hereinafter referred to as bits "00", "01", "10", and "11"). In one example, to store a least significant bit (LSB) "1" in the first transistor 202, the source and drain terminals of the first transistor 202 are not connected to the first bit-line BL0. In another example, to store an LSB "1" in the first transistor 202, the source and drain terminals of the first transistor 202 are both connected to the first bit-line BL0. In yet another example, to store an LSB "0" in the first transistor 202, either the source terminal or the drain terminal of the first transistor 202 is connected to the first bit-line BL0. In one example, to store a most significant bit (MSB) "1" in the first transistor 202, the source and drain terminals of the first transistor 202 are not connected to the second bit-line BL1. In another example, to store an MSB "1" in the first transistor 202, the source and drain terminals of the first transistor 202 are both connected to the second bit-line BL1. In yet another example, to store an MSB "0" in the first transistor 202, either the source terminal or the drain terminal of the first transistor 202 is connected to the second bit-line BL1.

The first programmable metal track 220a connects the source terminal of both the first and third transistors 202 and 206 to the first virtual ground line VGND0. However, the connection of the source terminals of both the first and third transistors 202 and 206 to the first virtual ground line VGND0 is based on the dual-bit data corresponding to the first and third transistors 202 and 206. In one example, the source terminal of the first transistor 202 is connected to the first virtual ground line VGND0 and the source terminal of the third transistor 206 is connected to the third bit-line BL2 for storing the dual-bit data corresponding to the first and third transistors 202 and 206. The first programmable metal track 220a connects the source terminal of the first transistor 202 to the first virtual ground line VGND0. However, if width of the first programmable metal track 220a is not adjusted, the first programmable metal track 220a gets connected to the fourth non-programmable metal track 218d which further connects the source terminal of the third transistor 206 to the first virtual ground line VGND0. Thus, by adjusting the width of the first programmable metal track 220a, undesirable connection between the first programmable metal track 220a and the fourth non-programmable metal track 218d is prevented. It will be apparent to a person skilled in the art that the width of the first through sixth programmable metal tracks 220a-220f is adjusted based on the connections of the source and drain terminals of the first through eighth transistors 202-216 with the corresponding first and second virtual ground lines VGND0 and VGND1. The adjustment of the width of the first through sixth programmable metal tracks 220a-220f is explained in FIG. 3B.

It will be apparent to a person skilled in the art that that the scope of the ROM device 200 is not limited to having eight bit-lines BL0-BL7 and may have any number of bit-lines, such as two bit-lines, four bit-lines, and so on.

Figure 3B:
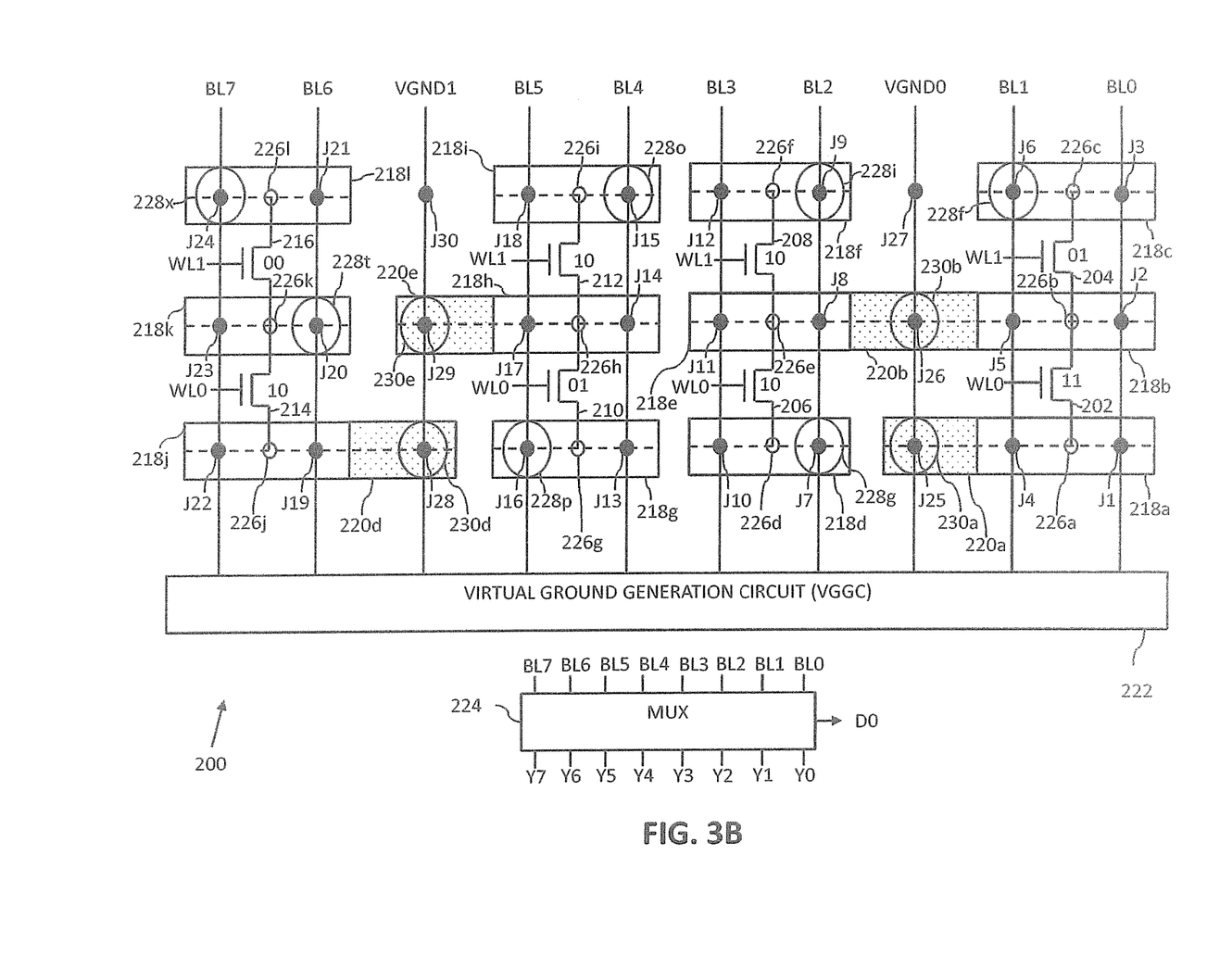
FIG. 3B is a schematic circuit diagram of a ROM device that illustrates storing and reading two bits of data in accordance with an embodiment of the present invention.

Referring now to FIG. 3B, a schematic circuit diagram of the ROM device 200 that illustrates storing of the dual-bit data in the first through eighth transistors 202-216 and reading of the stored dual-bit data on the first through eighth bit-lines BL0-BL7 in accordance with an embodiment of the present invention is shown. The dual-bit data to be stored in each of the first through eighth transistors 202-216 is shown in Table 1 below:

TABLE 1

Dual-bit data to be stored by the first through eighth transistors 202-216

| | Transistor | | | | | | |
|---|---|---|---|---|---|---|---|
| | 202 | 204 | 206 | 208 | 210 | 212 | 214 | 216 |
| Dual-bit data | 11 | 01 | 10 | 10 | 01 | 10 | 10 | 00 |

The first transistor 202 stores "11". Thus, the source terminal of the first transistor 202 is connected to the first virtual ground line VGND0 by way of the first non-programmable metal track 218a and the first programmable metal track 220a. The twenty-fifth via 230a is inserted at the twenty-fifth junction J25 to connect the first programmable metal track 220a to the first virtual ground line VGND0. Further, the second programmable metal track 220b is disposed beneath the first virtual ground line VGND0 and the twenty-sixth via 230b is inserted at the twenty-sixth junction J26 to connect the drain terminal of the first transistor 202 to the first virtual ground line VGND0 by way of the second non-programmable metal track 218b. The second transistor 204 stores bits "01". The first and second transistors 202 and 204 have a common drain terminal, i.e., the second transistor 204 shares the drain terminal with the first transistor 202. Therefore, the drain terminal of the second transistor 204 is also connected to the first virtual ground line VGND0. The source terminal of the second transistor 204 is connected to the second bit-line BL1 by way of the third non-programmable metal track 218c. The sixth via 228f is inserted at the sixth junction J6 to connect the third non-programmable metal track 218c to the second bit-line BL1.

The third transistor 206 stores "10". Thus, the seventh via 228g is inserted at the seventh junction J7 to connect the source terminal of the third transistor 206 to the third bit-line BL2 by way of the fourth non-programmable metal track 218d. The width of the first programmable metal track 220a is adjusted in a way that the first programmable metal track 220a is not connected to the fourth non-programmable metal track 218d. Further, the second programmable metal track 220b is disposed beneath the first virtual ground line VGND0 and the twenty-sixth via 230b is inserted at the twenty-sixth junction J26 to connect the drain terminal of the third transistor 206 to the first virtual ground line VGND0 by way of the fifth non-programmable metal track 218e. The third and fourth transistors 206 and 208 have a common drain terminal, i.e., the fourth transistor 208 shares the drain terminal with the third transistor 206. Hence, the drain terminal of the fourth transistor 208 is also connected to the first virtual ground line VGND0. The fourth transistor 208 stores the bits "10". Therefore, the source terminal of the fourth transistor 208 is connected to the third bit-line BL2 by way of the sixth non-programmable metal track 218f. The ninth via 228i is inserted at the ninth junction J9 to connect the third bit-line BL2 to the sixth non-programmable metal track 218f.

The fifth and sixth transistors 210 and 212 store the bits "01" and "10", respectively. The source terminal of the fifth transistor 210 is connected to the sixth bit-line BL5 by way of the seventh non-programmable metal track 218g and the sixteenth via 228p that is inserted at the sixteenth junction J16. Further, the fifth programmable metal track 220e is disposed beneath the second virtual ground line VGND1 and the twenty-ninth via 230e is inserted at the twenty-ninth junction J29 to connect the drain terminal of the fifth transistor 210 to the second virtual ground line VGND1 by way of the eighth non-programmable metal track 218h. The fifth and sixth transistors 210 and 212 have a common drain terminal, i.e., the sixth transistor 212 shares the drain terminal with the fifth transistor 210. Hence, the drain terminal of the sixth transistor 212 is also connected to the second virtual ground line VGND1. The sixth transistor 212 stores the bits "10". Therefore, the source terminal of the sixth transistor 212 is connected to the fifth bit-line BL4 by way of the ninth non-programmable metal track 218i. The fifteenth via 228o is inserted at the fifteenth junction J15 to connect the ninth non-programmable metal track 218i to the fifth bit-line BL4.

The seventh and eighth transistors 214 and 216 store the bits "10" and "00", respectively. The source terminal of the seventh transistor 214 is connected to the second virtual ground line VGND1 by way of the tenth non-programmable metal track 218j, the fourth programmable metal track 220d, and the twenty-eighth via 230d. The twenty-eighth via 230d is inserted at the twenty-eighth junction J28 to connect the fourth programmable metal track 220d to the second virtual ground line VGND1. Further, the drain terminal of the seventh transistor 214 is connected to the seventh bit-line BL6 by way of the eleventh non-programmable metal track 218k and the twentieth via 228t that is inserted at the twentieth junction J20. The seventh and eighth transistors 214 and 216 have a common drain terminal, i.e., the eighth transistor 216 shares its drain terminal with the seventh transistor 214. Therefore, the drain terminal of the eighth transistor 216 is also connected to the seventh bit-line BL6. The source terminal of the eighth transistor 216 is connected to the eighth bit-line BL7 by way of the twelfth non-programmable metal track 218l and the twenty-fourth via 228x inserted at the twenty-fourth junction J24 to store the bits "00".

During read operation, the bits stored in the first through eighth transistors 202-216 is read by way of the first through eighth bit-lines BL0-BL7, and the first and second virtual ground lines VGND0 and VGND1. For example, the bits stored in the first transistor 202 are read by way of the first bit-line pair and the first virtual ground line VGND0. For reading the bits "11" stored in the first transistor 202, the address decoder activates the first word-line WL0, which switches ON the first transistor 202. To read the LSB "1", the VGGC 222 connects the first bit-line BL0 to the first voltage level "RD" and the second through eighth bit-lines BL1-BL7 to ground. Since neither of the source and drain terminals of the first transistor 202 are connected to the first bit-line BL0, the voltage of the first bit-line BL0 is not discharged to ground. Therefore, the LSB "1" is read at the first bit-line BL0 through the output terminal D0. It will be apparent to a person skilled in the art that to read the MSB "1", the VGGC 222 connects the second bit-line BL1 to the first voltage level "RD", and the first bit-line BL0 to ground.

In order to read the bits "01" stored in the second transistor 204, the address decoder activates the second word-line W1, which switches ON the second transistor 204. To read the MSB "0", the VGGC 222 connects the second bit-line BL1 to the first voltage level "RD", and the first bit-line BL0 and third through eighth bit-lines BL2-BL7 to ground. Since the source terminal of the second transistor 204 is connected to the second bit-line BL1, the voltage of the second bit-line BL1 discharges to ground by way of the second transistor 204 and the first bit-line BL0. Therefore, the MSB "0" is read on the second bit-line BL1 through the output terminal D0. It will be apparent to a person skilled in the art that to read the LSB "1", the VGGC 222 connects the first bit-line BL0 to the first voltage level "RD", and the second bit-line BL1 to ground. Similarly, the bits stored in the third and fourth transistors 206 and 208 are read on the third and fourth bit-lines BL2 and BL3, the bits stored in the fifth and sixth transistors 210 and 212 are read on the fifth and sixth bit-lines BL4 and BL5, and the bits stored in the seventh and eighth transistors 214 and 216 are read on the seventh and eighth bit-lines BL6 and BL7.

As the first virtual ground line VGND0 is shared between the first and second columns, and the second virtual ground line VGND1 is shared between the third and fourth columns, the complexity of the ROM device 200 is reduced in comparison to the ROM device 100, which uses separate virtual ground lines for each column. In the ROM device 200, the data is stored by the use of dual layer programming, i.e., metallization, which includes disposing at least one of the first through sixth programmable metal tracks 220a-220f beneath the corresponding first and second virtual ground lines VGND0 and VGND1, and via formation, which includes inserting at least one of the first through twenty-fourth vias 228a-228x. The dual layer programming enables the ROM device 200 to share the first and second virtual ground lines VGND0 and VGND1. Further, the sharing of the first and second virtual ground lines VGND0 and VGND1 allows storing of dual-bit data in the ROM device 200 by using fewer virtual ground lines in comparison to the ROM device 100, thereby reducing an area of the ROM device 200 and hence achieving high density. Since each of the first through eighth transistors 202-216 corresponds to two bit-lines of the first through eighth bit-lines BL0-BL7, the width of each of the first through eighth transistors 202-216 is greater than their respective minimum processing widths. Hence, the ROM device 200 can be operated at low input voltages. It will be apparent to a person skilled in the art that the source and drain terminals of the first through eighth transistors 202-216 can have different connections from the connections described supra for storing the dual-bit data of the Table 1.

Figure 4A:
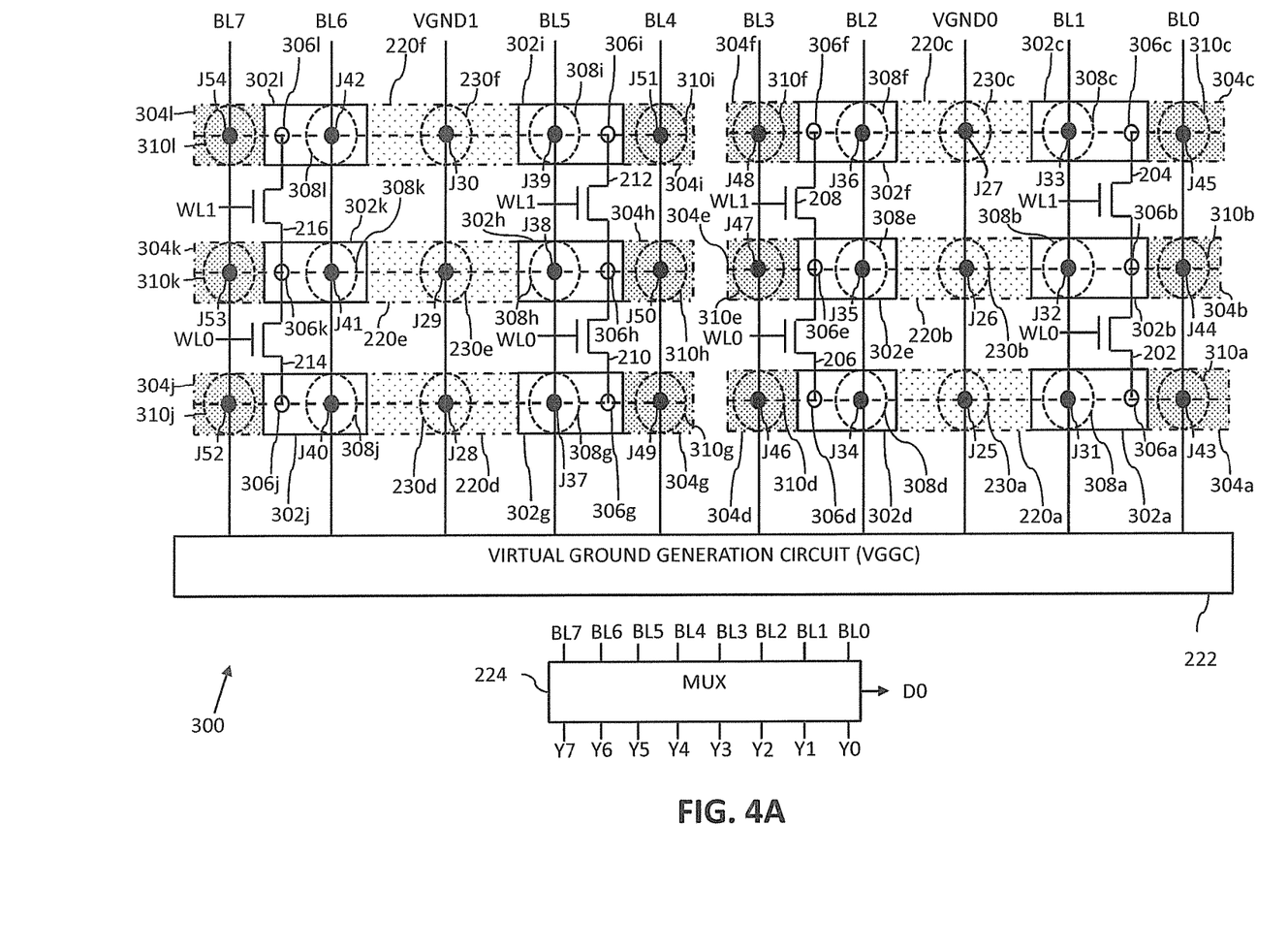
FIG. 4A is a schematic circuit diagram of a ROM device in accordance with another embodiment of the present invention.

Referring now to FIG. 4A, a schematic circuit diagram of a ROM device 300 in accordance with another embodiment of the present invention is shown. The ROM device 300 includes the first through eighth transistors 202-216, the first through eighth bit-lines BL0-BL7, the first and second virtual ground lines VGND0 and VGND1, the first and second word-lines WL0 and WL1, the first through sixth programmable metal tracks 220a-220f, the VGGC 222, and the multiplexer 224. The ROM device 300 further includes thirteenth through twenty-fourth non-programmable metal tracks 302a-302l and seventh through eighteenth programmable metal tracks 304a-304l. In one embodiment, the first through sixth programmable metal tracks 220a-220f, the thirteenth through twenty-fourth non-programmable metal tracks 302a-302l form the first metal layer. Further, the first through eighth bit-lines BL0-BL7, and the first and second virtual ground lines VGND0 and VGND1 form the second metal layer.

The thirteenth through twenty-fourth non-programmable metal tracks 302a-302l are fixed metal strips and are disposed horizontally to connect the first through eighth transistors 202-216 to the corresponding second bit-line BL1, the third bit-line BL2, the sixth bit-line BL5, and the seventh bit-line BL6. The thirteenth through twenty-fourth non-programmable metal tracks 302a-302l are disposed beneath the corresponding second bit-line BL1, the third bit-line BL2, the sixth bit-line BL5, and the seventh bit-line BL6 as illustrated in FIG. 4A. The thirteenth through twenty-fourth non-programmable metal tracks 302a-302l form thirty-first through forty-second junctions J31-J42 with the second bit-line BL1, the third bit-line BL2, the sixth bit-line BL5, and the seventh bit-line BL6 as illustrated in FIG. 4A. In one example, the thirteenth non-programmable metal track 302a disposed beneath the second bit-line BL1 forms the thirty-first junction J31 with the second bit-line BL1. Further, the thirteenth through twenty-fourth non-programmable metal tracks 302a-302l are connected to the source and drain terminals of the corresponding first through eighth transistors 202-216 by way of the thirteenth through twenty-fourth metal contacts 306a-306l as illustrated in FIG. 4A. Furthermore, thirty-first through forty-second vias 308a-308l are inserted at the thirty-first through forty-second junctions J31-J42, respectively, for connecting the source and drain terminals of the corresponding first through eighth transistors 202-216 to the corresponding second bit-line BL1, the third bit-line BL2, the sixth bit-line BL5, and the seventh bit-line BL6 as illustrated in FIG. 4A. In one example, the thirteenth non-programmable metal track 302a connects the source terminal of the first transistor 202 to the second bit-line BL1 by way of the thirty-first via 308a inserted at the thirty-first junction J31.

The seventh through eighteenth programmable metal tracks 304a-304l are disposed horizontally to connect the first through eighth transistors 202-216 to the corresponding first bit-line BL0, the fourth bit-line BL3, the fifth bit-line BL4, and the eighth bit-line BL7. The seventh through eighteenth programmable metal tracks 304a-304l are disposed beneath the corresponding first bit-line BL0, the fourth bit-line BL3, the fifth bit-line BL4, and the eighth bit-line BL7. The seventh through eighteenth programmable metal tracks 304a-304l form forty-third through fifty-fourth junctions J43-J54 with the first bit-line BL0, the fourth bit-line BL3, the fifth bit-line BL4, and the eighth bit-line BL7. In one example, the seventh programmable metal track 304a disposed beneath the first bit-line BL0 forms the forty-third junction J43 with the first bit-line BL0. The seventh through eighteenth programmable metal tracks 304a-304l are disposed to connect the source and drain terminals of the first through eighth transistors 202-216 to one of the corresponding first bit-line BL0, the fourth bit-line BL3, the fifth bit-line BL4, and the eighth bit-line BL7 by way of forty-third through fifty-fourth vias 310a-310l and the thirteenth through twenty-fourth non-programmable metal tracks 302a-302l as illustrated in FIG. 4A. For example, the seventh programmable metal track 304a is disposed beneath the first bit-line BL0 to connect the source terminal of the first transistor 202 to the first bit-line BL0 by way of the forty-third via 310a and the thirteenth non-programmable metal track 302a.

Figure 4B:
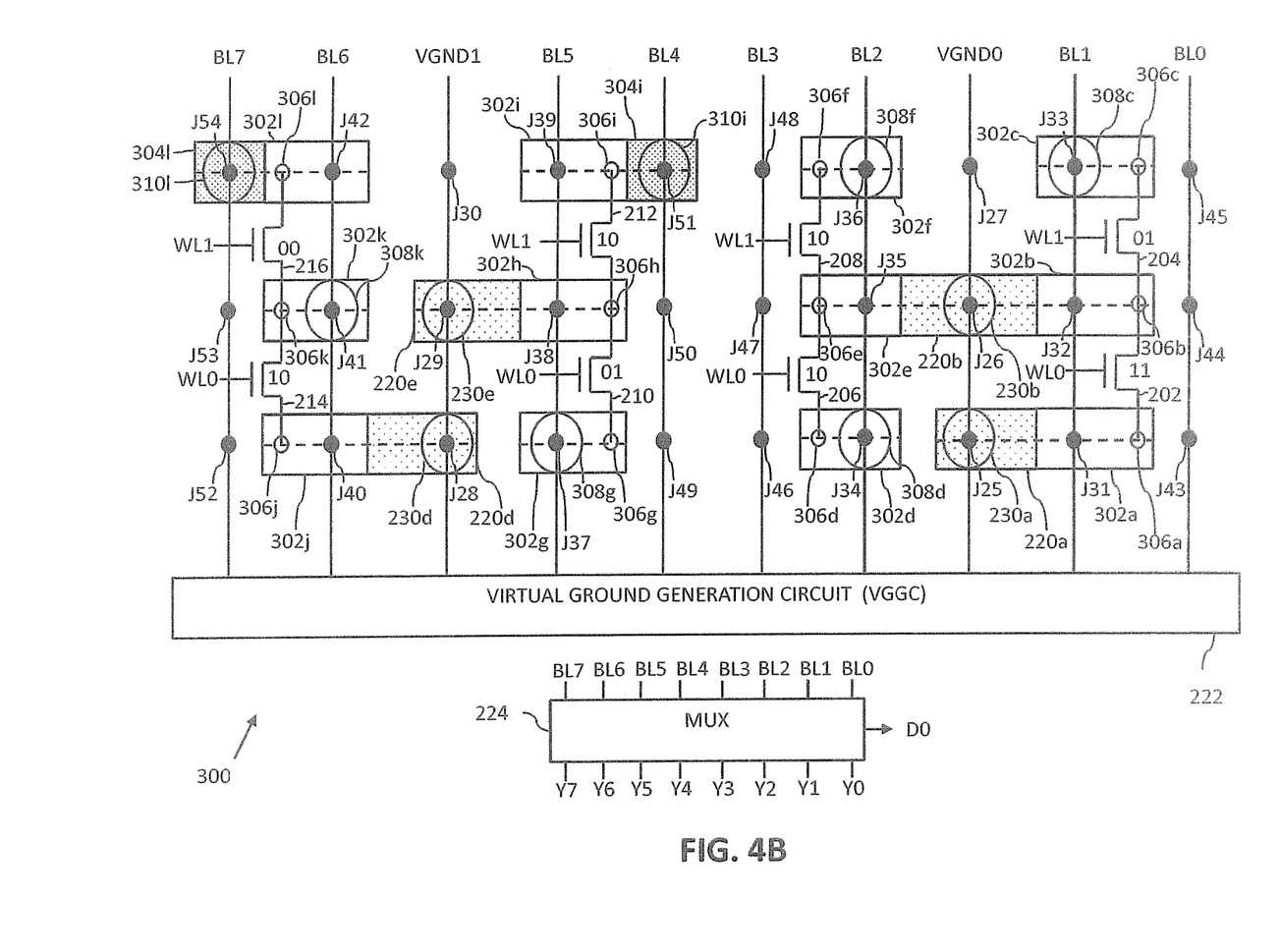
FIG. 4B is a schematic circuit diagram of a ROM device that illustrates storing and reading two bits of data in accordance with another embodiment of the present invention.

Referring now to FIG. 4B, a schematic circuit diagram of the ROM device 300 that illustrates storing of the dual-bit data in the first through eighth transistors 202-216 and reading of the stored dual-bit data on the first through eighth bit-lines BL0-BL7 of FIG. 4A in accordance with another embodiment of the present invention is shown. In one embodiment, Table 1 illustrates the dual-bit data to be stored in each of the first through eighth transistors 202-216.

The first transistor 202 stores the bits "11". The first programmable metal track 220a is disposed beneath the first virtual ground line VGND0 and the twenty-fifth via 230a is inserted at the twenty-fifth junction J25 to connect the source terminal of the first transistor 202 to the first virtual ground line VGND0 by way of the thirteenth non-programmable metal track 302*a*. The second programmable metal track 220*b* is disposed beneath the first virtual ground line VGND0 and the twenty-sixth via 230*b* is inserted at the twenty-sixth junction J26 to connect the drain terminal of the first transistor 202 to the first virtual ground line VGND0 by way of the fourteenth non-programmable metal track 302*b*. The first and second transistors 202 and 204 have a common drain terminal, i.e., the second transistor 204 shares the drain terminal with the first transistor 202. Hence, the drain terminal of the second transistor 204 is also connected to the first virtual ground line VGND0. The second transistor 204 stores the bits "01". Therefore, the source terminal of the second transistor 204 is connected to the second bit-line BL1 by way of the fifteenth non-programmable metal track 302*c* and the thirty-third via 308*c* inserted at the thirty-third junction J33.

The third transistor 206 stores the bits "10". Thus, the thirty-fourth via 308*d* is inserted at the thirty-fourth junction J34 to connect the source terminal of the third transistor 206 to the third bit-line BL2 by way of the sixteenth non-programmable metal track 302*d*. The drain terminal of the third transistor 206 is connected to the first virtual ground line VGND0 by way of the seventeenth non-programmable metal track 302*e*, the second programmable metal track 220*b*, and the twenty-sixth via 230*b* inserted at the twenty-sixth junction J26. Similarly, the fourth transistor 208 stores the bits "10".

It will be apparent to a person skilled in the art that to store the bits "01" in the fifth transistor 210, the source terminal of the fifth transistor 210 is connected to the sixth bit-line BL5 by way of the nineteenth non-programmable metal track 302*g* and the thirty-seventh via 308*g* that is inserted at the thirty-seventh junction J37. The drain terminal of the fifth transistor 210 is connected to the second virtual ground line VGND1 by way of the twentieth non-programmable metal track 302*h* and the fifth programmable metal track 220*e*. Further, the twenty-ninth via 230*e* is inserted at the twenty-ninth junction J29. The fifth and sixth transistors 210 and 212 have a common drain terminal, i.e., the sixth transistor 212 shares its drain terminal with the fifth transistor 210. Hence, the drain terminal of the sixth transistor 212 is also connected to the second virtual ground line VGND1. The sixth transistor 212 stores the bits "10". Therefore, the source terminal of the sixth transistor 212 is connected to the fifth bit-line BL4 by way of the twenty-first non-programmable metal track 302*i* and the fifteenth programmable metal track 304*i*. The fifty-first via 310*i* is inserted at the fifty-first junction J51 to connect the fifteenth programmable metal track 304*i* to the fifth bit-line BL4.

The seventh transistor 214 stores the bits "10". The source terminal of the seventh transistor 214 is connected to the second virtual ground line VGND1 by way of the fourth programmable metal track 220*d*, the twenty-second non-programmable metal track 302*j*, and the twenty-eighth via 230*d* inserted at the twenty-eighth junction J28. The drain terminal of the seventh transistor 214 is connected to the seventh bit-line BL6 by way of the twenty-third non-programmable metal track 302*k* and the forty-first via 308*k* inserted at the forty-first junction J41. Similarly, the eighth transistor 216 stores the bits "00".

In another embodiment, the source and drain terminals of the first through eighth transistors 202-216 have different connections from the connections described supra for storing the dual-bit data of the Table 1. In yet another embodiment, the first through eighth transistors 202-216 can store a combination of the bits that are different from the bits illustrated in Table 1.

To read the bits "10" stored in the third transistor 206, the address decoder activates the first word-line WL0, which switches ON the third transistor 206. To read the LSB "0", the VGGC 222 connects the third bit-line BL2 to the first voltage level "RD" and the first, second, and fourth through eighth bit-lines BL0, BL1, and BL3-BL7 to ground. Since the third bit-line BL2 is connected to the source terminal of the third transistor 206, the voltage of the third bit-line BL2 discharges to ground by way of the third transistor 206 and the first virtual ground line VGND0. Therefore, the LSB "0" is read on the third bit-line BL2 through the output terminal D0. It will be apparent to a person skilled in the art that to read the MSB "1", the VGGC 222 connects the fourth bit-line BL3 to the first voltage level "RD", and the third bit-line BL2 to ground. Similarly, the bits stored in the first, second, and fourth through eighth transistors 202, 204, and 208-216 are read on the corresponding first through eighth bit-lines BL0-BL7.

The ROM device 300 shares virtual ground lines between two adjacent columns. Further, the metal parasitic capacitance due to the first through eighth bit-lines BL0-BL7 reduces due to the implementation of the seventh through eighteenth programmable metal tracks 304*a*-304*l* in comparison to the conventional ROM device 100.

Figure 5:
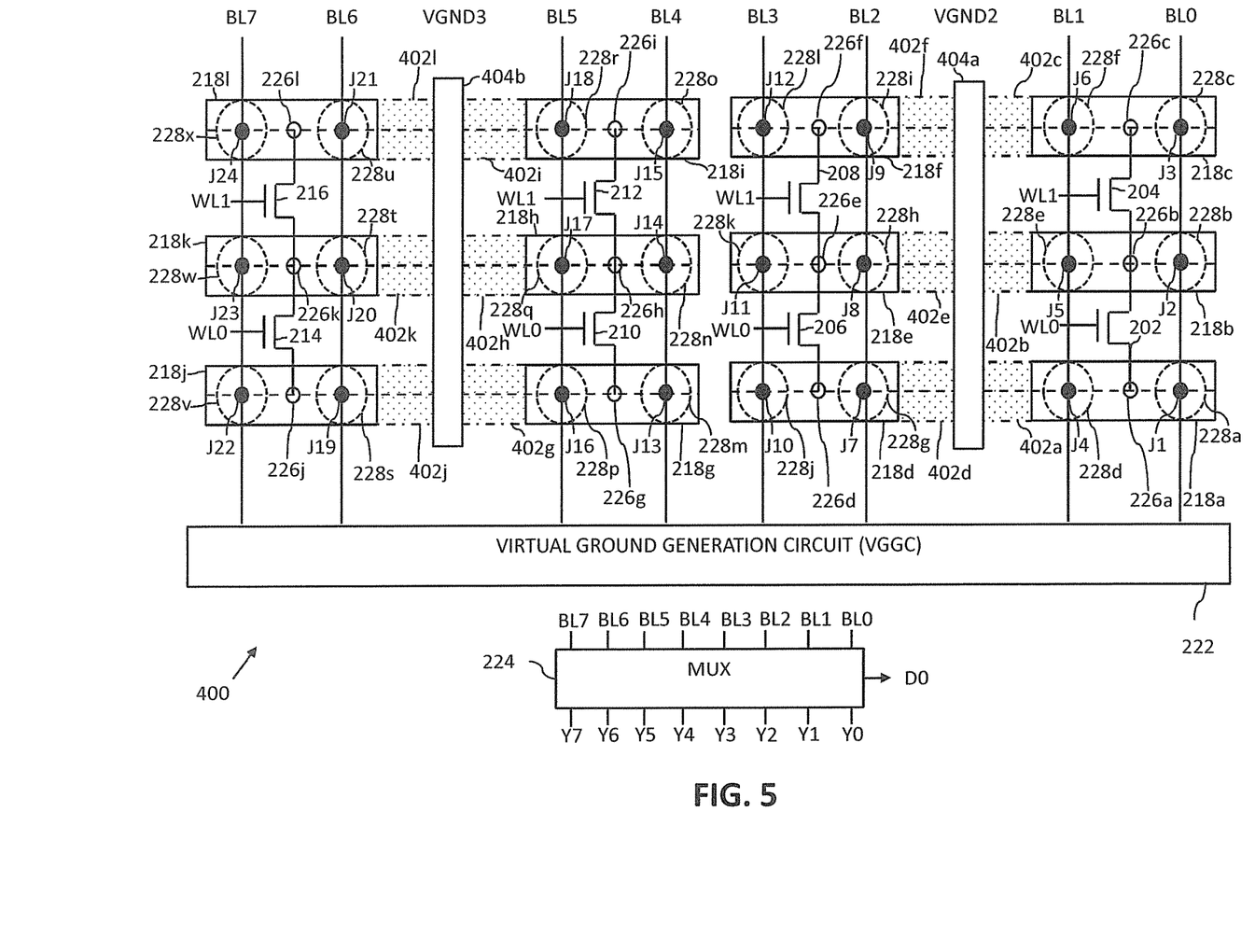
FIG. 5 is a schematic circuit diagram of a ROM device in accordance with another embodiment of the present invention.

Referring now to FIG. 5, a schematic circuit diagram of a ROM device 400 in accordance with another embodiment of the present invention is shown. The ROM device 400 includes the first through eighth transistors 202-216, the first through eighth bit-lines BL0-BL7, third and fourth virtual ground lines VGND2 and VGND3, the first and second word-lines WL0 and WL1, nineteenth through thirtieth programmable metal tracks 402*a*-402*l*, the VGGC 222, and the multiplexer 224. The ROM device 400 further includes first through twelfth non-programmable metal tracks 218*a*-218*l*.

The third virtual ground line VGND2 is disposed vertically between the first and second bit-line pairs such that the first and second columns share the third virtual ground line VGND2. Further, the fourth virtual ground line VGND3 is disposed vertically between the third and fourth bit-line pairs such that the third and fourth columns share the fourth virtual ground line VGND3. The third and fourth virtual ground lines VGND2 and VGND3 are twenty-fifth and twenty-sixth non-programmable metal tracks 404*a*-404*b*. In one embodiment, the twenty-fifth and twenty-sixth non-programmable metal tracks 404*a*-404*b* correspond to the first through twelfth non-programmable metal tracks 218*a*-218*l*.

The nineteenth through thirtieth programmable metal tracks 402*a*-402*l* are disposed horizontally to connect the first through eighth transistors 202-216 to the corresponding third and fourth virtual ground lines VGND2 and VGND3. The nineteenth through thirtieth programmable metal tracks 402*a*-402*l* connects the source and drain terminals of the first through eighth transistors 202-216 to the corresponding third and fourth virtual ground lines VGND2 and VGND3 by way of the first through twelfth non-programmable metal tracks 218*a*-218*l* as illustrated in FIG. 4. For example, the nineteenth programmable metal track 402*a* connects the source terminal of the first transistor 202 to the third virtual ground line VGND2 by way of the first non-programmable metal track 218*a*.

In one embodiment, the first through twelfth non-programmable metal tracks 218*a*-218*l*, the nineteenth through thirtieth programmable metal tracks 402a-402l, and the third and fourth virtual ground lines VGND2 and VGND3, i.e., the twenty-fifth and twenty-sixth non-programmable metal tracks 404a-404b form the first metal layer. Further, the first through eighth bit-lines BL0-BL7 form the second metal layer.

It will be apparent to a person skilled in the art that the connection of the source and drain terminals of the first through eighth transistors 202-216 with the corresponding third and fourth virtual ground lines VGND2 and VGND3 is based on the dual-bit data corresponding to the first through eighth transistors 202-216. In another embodiment, the third and fourth virtual ground lines VGND2 and VGND3 are disposed horizontally, to overlap the first and second word-lines WL0 and WL1.

It will be understood by a person skilled in the art that the two bits of data is stored in the ROM device 400 in the same way as the data is stored in the ROM devices 200 and 300.

Figure 6:
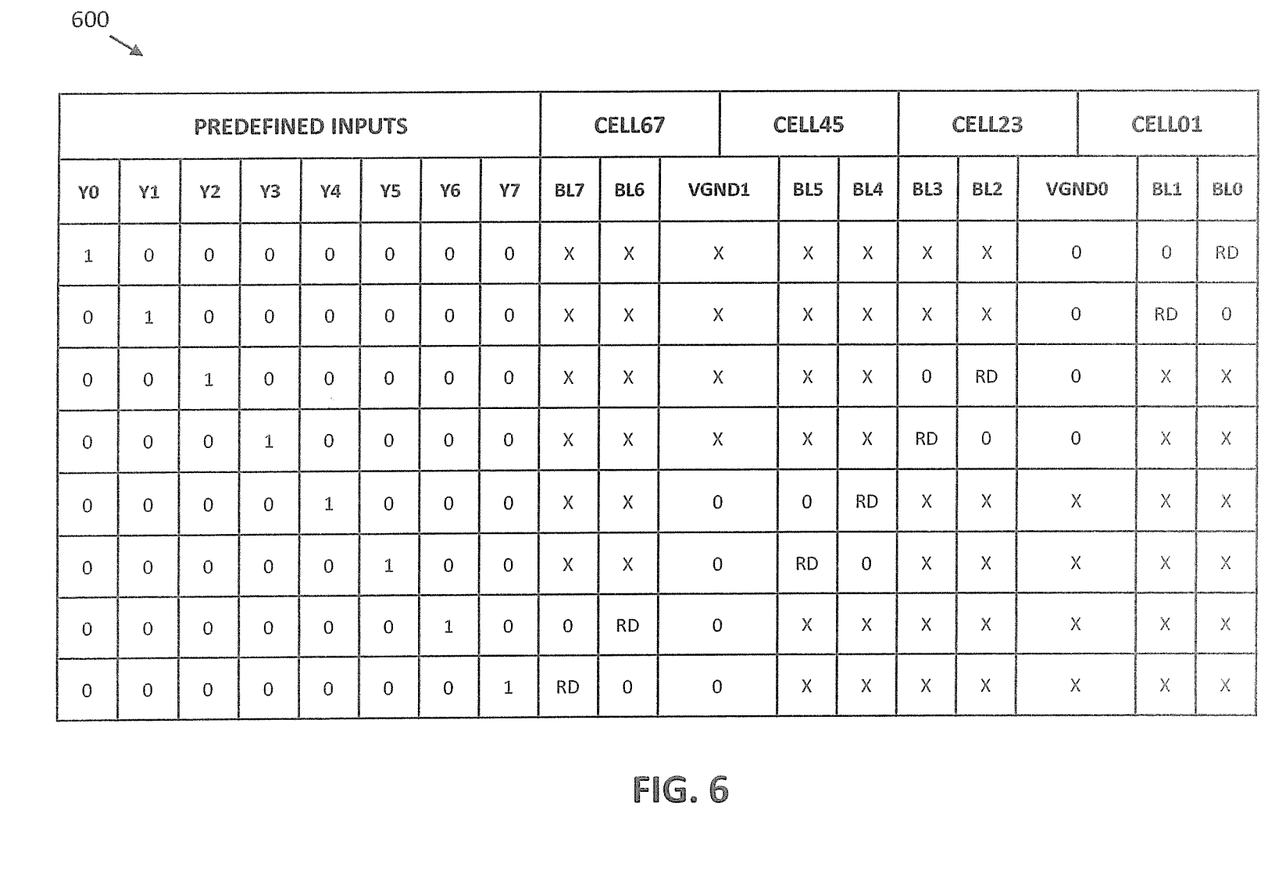
FIG. 6 illustrates a programming table in accordance with an embodiment of the present invention.

Referring now to FIG. 6, a programming table 600 in accordance with an embodiment of the present invention is shown. The programming table 600 illustrates logic states of the first through eighth predefined inputs at the corresponding first through eighth input terminals Y0-Y7 of the multiplexer 224 and voltage levels of the first through eighth bit-lines BL0-BL7 for reading the bits stored in the first through eighth transistors 202-216.

The VGGC 222 controls the voltage levels of the first through eighth bit-lines BL0-BL7 to read the bits stored in the first through eighth transistors 202-216. In one example, the address decoder activates the first word-line WL0 to read the bits stored in the first transistor 202. The first transistor 202 is associated with the first and second bit-lines BL0 and BL1. The LSB of the bits stored in the first transistor 202 is read on the first bit-line BL0 and the MSB of the bits stored in the first transistor 202 is read on the second bit-line BL1. To read the LSB of the bits stored in the first transistor 202, the first input terminal Y0 of the multiplexer 224 receives the first predefined input, which is high and the second through eighth input terminals Y1-Y7 receive the second through eighth predefined inputs, respectively, which are low. Then the VGGC 110 connects the first bit-line BL0 to the first voltage level, represented by "RD" in the programming table 600, and the second bit-line BL1 to ground. The third through eighth bit-lines BL2-BL7 are in "don't care" state represented by "x" in the programming table 600. Thus, the LSB of the bits of the first transistor 202 is read on the first bit-line BL0 through the output terminal D0. To read the MSB of the bits of the first transistor 202, the second input terminal Y1 of the multiplexer 224 receives the second predefined input that is high and the first input terminal Y0 and the third through eighth input terminals Y2-Y7 receive the first and third through eighth predefined inputs, respectively, which are low; then the VGGC 222 connects the second bit-line BL1 to the first voltage level "RD" and the first bit-line BL0 to ground. The third through eighth bit-lines BL2-BL7 are "don't care". Thus, the MSB of the bits of the first transistor 202 is read on the second bit-line BL1 through the output terminal D0.

It will be apparent to a person skilled in the art that the multiplexer 224 can have any number of input terminals, such as Y0 to Y1, Y0 to Y3, Y0 to Y16, and the like.

Sharing the virtual ground lines, such as the first through fourth virtual ground lines VGND0-VGND3 between the corresponding columns of the first through eighth memory cells 202-216, i.e., the first through eighth transistors 202-216, reduces the design complexity of the ROM devices 200, 300 and 400. As fewer virtual ground lines are required, the area of the ROM devices 200, 300 and 400 is reduced. Since each memory cell of the first through eighth memory cells 202-216 corresponds to two bit-lines, such as the corresponding first through eighth bit-lines BL0-BL7, the width of each memory cell is greater than corresponding minimum processing width. Hence, the ROM devices 200, 300, and 400 can operate at a low input voltage. The first through sixth programmable metal tracks 220a-220f, the seventh through eighteenth programmable metal tracks 304a-304l, and the nineteenth through thirtieth programmable metal tracks 402a-402l are defined only as necessary based on the data stored in a memory cell, hence the parasitic capacitance in the ROM devices 200, 300, and 400 is reduced compared to prior art devices.

In the claims, the words 'comprising', 'including' and 'having' do not exclude the presence of other elements or steps then those listed in a claim. The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A read-only memory (ROM) device, comprising:
   a plurality of memory cells arranged in an array including a plurality of rows and a plurality of columns, wherein each memory cell stores two bits of data, and wherein first and second memory cells of the plurality of memory cells are adjacent to each other, have a common drain terminal, and are arranged in a first column of the plurality of columns;
   a plurality of bit-line pairs disposed vertically and associated with the plurality of columns, wherein a first bit-line pair of the plurality of bit-line pairs is associated with the first column;
   a virtual ground line disposed vertically and shared by the first column and a second column of the plurality of columns, wherein the second column is adjacent to the first column;
   a first programmable metal track disposed horizontally, that connects the first memory cell to the virtual ground line, wherein the first programmable metal track is defined based on a value of the two data bits stored in the first memory cell; and
   a plurality of non-programmable metal tracks corresponding to the plurality of memory cells and disposed horizontally, wherein a first non-programmable metal track is connected to one of a source terminal and a drain terminal of the first memory cell by way of a metal contact, wherein the first non-programmable metal track connects the first memory cell to the first bit-line pair, and wherein the first programmable metal track connects the first memory cell to the virtual ground line by way of the first non-programmable metal track.

2. The ROM device of claim 1, wherein the first memory cell includes a transistor for storing the two bits of data.

3. The ROM device of claim 2, wherein the transistor is an n-channel metal oxide semiconductor (NMOS) transistor and a p-channel metal oxide semiconductor (PMOS) transistor.

4. The ROM device of claim 1, wherein the virtual ground line is disposed between the first bit-line pair and a second bit-line pair of the plurality of bit-line pairs, and wherein the second bit-line pair is associated with the second column.

5. The ROM device of claim 1, further comprising a virtual ground generation circuit that controls voltage levels of the first bit-line pair to read the two bits of data stored in the first memory cell.

6. The ROM device of claim 5, wherein the two bits of data stored in the first memory cell is read by way of the virtual ground line and the first bit-line pair.

7. The ROM device of claim 6, wherein the virtual ground generation circuit grounds a first bit-line of the first bit-line pair to read a first bit of the two bits of data stored in the first memory cell, and wherein the first bit is read on a second bit-line of the first bit-line pair.

8. The ROM device of claim 7, wherein the virtual ground generation circuit grounds the second bit-line to read a second bit of the two bits of data stored in the first memory cell, and wherein the second bit is read on the first bit-line.

9. A read-only memory (ROM) device, comprising:
a plurality of memory cells arranged in an array including a plurality of rows and a plurality of columns, wherein each memory cell stores dual-bit data, and wherein first and second memory cells of the plurality of memory cells are adjacent to each other, have a common drain terminal, and are arranged in a first column of the plurality of columns;
a plurality of bit-line pairs that are disposed vertically and associated with the plurality of columns, wherein a first bit-line pair of the plurality of bit-line pairs is associated with the first column;
a virtual ground line disposed vertically, and shared between the first column and a second column of the plurality of columns, wherein the second column is adjacent to the first column;
a first programmable metal track disposed horizontally, that connects the first memory cell to the virtual ground line, wherein the first programmable metal track is defined based on a value of the two data bits stored in the first memory cell;
a second programmable metal track disposed horizontally, that connects the first memory cell to a first bit-line of the first bit-line pair, wherein the second programmable metal track is defined based on the value of the two data bits stored in the first memory cell; and
a plurality of non-programmable metal tracks corresponding to the plurality of memory cells and disposed horizontally,
wherein a first non-programmable metal track is connected to one of a source terminal and a drain terminal of the first memory cell by way of a metal contact, and the first non-programmable metal track connects the first memory cell to a second bit-line of the first bit-line pair, and
wherein the first programmable metal track connects the first memory cell to the virtual ground line by way of the first non-programmable metal track, and the second programmable metal track connects the first memory cell to the first bit-line by way of the first non-programmable metal track.

10. The ROM device of claim 9, wherein the first memory cell includes a transistor for storing the two bits of data.

11. The ROM device of claim 10, wherein the transistor is at least one of an n-channel metal oxide semiconductor (NMOS) transistor and a p-channel metal oxide semiconductor (PMOS) transistor.

12. The ROM device of claim 9, wherein the virtual ground line is disposed between the first bit-line pair and a second bit-line pair of the plurality of bit-line pairs, and wherein the second bit-line pair is associated with the second column.

13. The ROM device of claim 9, further comprising a virtual ground generation circuit that controls voltage levels of the first bit-line pair to read the two bits of data stored in the first memory cell.

14. The ROM device of claim 13, wherein the two bits of data stored in the first memory cell is read by way of the virtual ground line and the first bit-line pair.

15. The ROM device of claim 14, wherein the virtual ground generation circuit grounds the first bit-line to read a first bit of the two bits of data stored in the first memory cell, and wherein the first bit is read on a second bit-line of the first bit-line pair.

16. The ROM device of claim 15, wherein the virtual ground generation circuit grounds the second bit-line to read a second bit of the two bits of data stored in the first memory cell, and wherein the second bit is read on the first bit-line.

* * * * *